United States Patent
Moore et al.

(10) Patent No.: US 10,837,119 B2
(45) Date of Patent: Nov. 17, 2020

(54) MICROELECTRONIC SUBSTRATE ELECTRO PROCESSING SYSTEM

(71) Applicant: APPLIED Materials, Inc., Santa Clara, CA (US)

(72) Inventors: Robert B. Moore, Lewistown, MT (US); David Silvetti, Morgan Hill, CA (US); Paul Wirth, Kalispell, MT (US); Randy Harris, Kalispell, MT (US); Daniel J. Woodruff, Kalispell, MT (US); Gregory J. Wilson, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 238 days.

(21) Appl. No.: 16/013,686

(22) Filed: Jun. 20, 2018

(65) Prior Publication Data
US 2018/0298513 A1    Oct. 18, 2018

Related U.S. Application Data

(62) Division of application No. 15/190,370, filed on Jun. 23, 2016, now Pat. No. 10,087,544, which is a
(Continued)

(51) Int. Cl.
*C25D 17/06*    (2006.01)
*C25D 17/00*    (2006.01)
(Continued)

(52) U.S. Cl.
CPC ............... *C25D 17/06* (2013.01); *C25D 7/12* (2013.01); *C25D 17/001* (2013.01);
(Continued)

(58) Field of Classification Search
CPC .... C25D 17/001; C25D 17/005; C25D 17/06; C25D 7/12; H01L 21/68707;
(Continued)

(56) References Cited

U.S. PATENT DOCUMENTS 4,466,864 A    8/1984    Bacon et al.
5,419,823 A    5/1995    Lazaro et al.
(Continued)

FOREIGN PATENT DOCUMENTS

CN    100382235 C    4/2008

OTHER PUBLICATIONS

Taiwan Intellectual Property Office, Examination Report for Taiwan Application No. 107106614; dated Aug. 21, 2018, English translation only.
(Continued)

*Primary Examiner* — Ciel P Contreras
(74) *Attorney, Agent, or Firm* — Perkins Coie LLP; Kenneth H. Ohriner

(57) ABSTRACT

In a processing system for electroplating semiconductor wafers and similar substrates, the contact ring of the electroplating processor is removed from the rotor of the processor and replaced with a previously deplated contact ring. This allows the contact ring to be deplated in ring service module of the system, while the processor continues to operate. Wafer throughput is improved. The contact ring may be attached to a chuck for moving the contact ring between the processors and the ring service module, with the chuck quickly attachable and releasable to the rotor.

13 Claims, 18 Drawing Sheets

Related U.S. Application Data division of application No. 14/259,492, filed on Apr. 23, 2014, now Pat. No. 9,399,827.

(60) Provisional application No. 61/817,223, filed on Apr. 29, 2013.

(51) Int. Cl.
  *C25D 7/12* (2006.01)
  *H01L 21/687* (2006.01)
  *H01L 21/768* (2006.01)

(52) U.S. Cl.
  CPC ...... *C25D 17/005* (2013.01); *H01L 21/68707* (2013.01); *H01L 21/68721* (2013.01); *H01L 21/68764* (2013.01); *H01L 21/76879* (2013.01)

(58) Field of Classification Search
  CPC ......... H01L 21/68721; H01L 21/68764; H01L 21/76879
  See application file for complete search history.

(56) References Cited

U.S. PATENT DOCUMENTS

| | | | |
|---|---|---|---|
| 6,251,236 B1 | 6/2001 | Stevens | |
| 6,258,223 B1 | 7/2001 | Cheung et al. | |
| 6,612,915 B1 | 9/2003 | Uzoh | |
| 6,623,609 B2 | 9/2003 | Harris et al. | |
| 6,726,823 B1 | 4/2004 | Wang | |
| 7,198,694 B2 | 4/2007 | Woodruff et al. | |
| 7,332,062 B1 | 2/2008 | Reder et al. | |
| 7,351,314 B2 | 4/2008 | Klocke et al. | |
| 7,371,306 B2 | 5/2008 | Davis et al. | |
| 7,585,398 B2 | 9/2009 | Hanson et al. | |
| 7,625,821 B2 | 12/2009 | Dolechek et al. | |
| 7,898,089 B2 | 3/2011 | Dolechek et al. | |
| 8,500,968 B2 | 8/2013 | Woodruff et al. | |
| 9,399,827 B2 | 7/2016 | Moore et al. | |
| 2002/0029961 A1 | 3/2002 | Dordi et al. | |
| 2005/0050767 A1 | 3/2005 | Hanson et al. | |
| 2011/0308739 A1* | 12/2011 | McCutcheon | H01L 21/67092 156/766 |
| 2012/0037495 A1 | 2/2012 | Woodruff | |
| 2013/0276978 A1* | 10/2013 | Bluck | C23C 16/4585 156/345.3 |

OTHER PUBLICATIONS

Korean Intellectual Property Office, Office Action in Korean Application No. 10-2019-7023793 with English translation; dated Sep. 11, 2019; 6 pages.

International Searching Authority, International Application Division, Korean Intellectual Property Office, "International Search Report and the Written Opinion" issued in International Application No. PCT/US2014/035731 (dated Aug. 22, 2014).

First Office Action for Chinese Patent Application No. 201480022902.3; dated May 23, 2017; 10 pages.

Taiwan Intellectual Property Office, Office Action for Taiwan Application No. 103115005; dated Nov. 29, 2017, English translation only.

Chinese National Intellectual Property Administration, First Office Action for Chinese Application No. 201711318432.7; dated Feb. 3, 2019; 9 pages.

* cited by examiner

MICROELECTRONIC SUBSTRATE ELECTRO PROCESSING SYSTEM

PRIORITY CLAIM

This application is a division of U.S. patent application Ser. No. 15/190,370, filed Jun. 23, 2016, now pending, which is a division of U.S. patent application Ser. No. 14/259,492, filed Apr. 23, 2014, and now U.S. Pat. No. 9,399,827, which claims priority to U.S. Provisional Patent Application No. 61/817,223, filed Apr. 29, 2013 and incorporated herein by reference.

BACKGROUND OF THE INVENTION

Microelectronic devices are generally formed on a semiconductor wafer or other type substrate or workpiece. In a typical manufacturing process, one or more thin metal layers are formed on a wafer to produce microelectronic devices and/or to provide conducting lines between devices.

The metal layers are generally applied to the wafers via electrochemical plating in an electroplating processor. A typical electroplating processor includes a vessel or bowl for holding an electroplating solution, one or more anodes in the bowl in contact the electroplating solution, and a head having a contact ring with multiple electrical contacts that touch the wafer. The front surface of the wafer is immersed in the electroplating solution and an electrical field causes metal ions in the electroplating solution to plate out onto the wafer, forming a metal layer.

In so-called "wet-contact" processors, the electrical contacts are exposed to the electroplating solution during a plating cycle. Consequently, the metal ions in the electroplating solution also plate out onto the contacts. The contacts, however, may plate at different rates with the result that some contacts can have a relatively greater or lesser surface area contacting the wafer, as plated-on metal builds up on the contacts over time. This reduces the uniformity of the metal layer plated on the wafer. It can also contaminate the wafer via poorly adhering metal particles separating from the contacts and depositing onto the wafer. To avoid this result, the contacts must be periodically "de-plated" to remove the metal that plates onto the contacts during a plating cycle, as part of ongoing maintenance of the reactor.

Typically, the contacts are deplated by immersing the contact assembly into the plating solution while passing reverse electrical current through them. The reverse current causes the plating cycle to reverse, moving metal off of the contacts and back into the solution. However, the reverse current must be limited to avoid degrading the plating solution. The rate of deplating is also limited by amount of agitation that can be provided to the plating solution around the contacts. Consequently, the contact deplating operation takes significant time to complete.

So-called dry contact electroplating processors use a seal to keep the plating solution away portions of the contacts. The seal must be periodically cleaned to work effectively and avoid contaminating the wafer. The need to maintain the contacts and the seal reduces the throughput or use efficiency of the electroplating system. Accordingly, improved designs are needed.

BRIEF DESCRIPTION OF THE DRAWINGS

In the drawings the same reference number indicates the same element in each of the views.

DETAILED DESCRIPTION OF THE DRAWINGS

Figure 1:
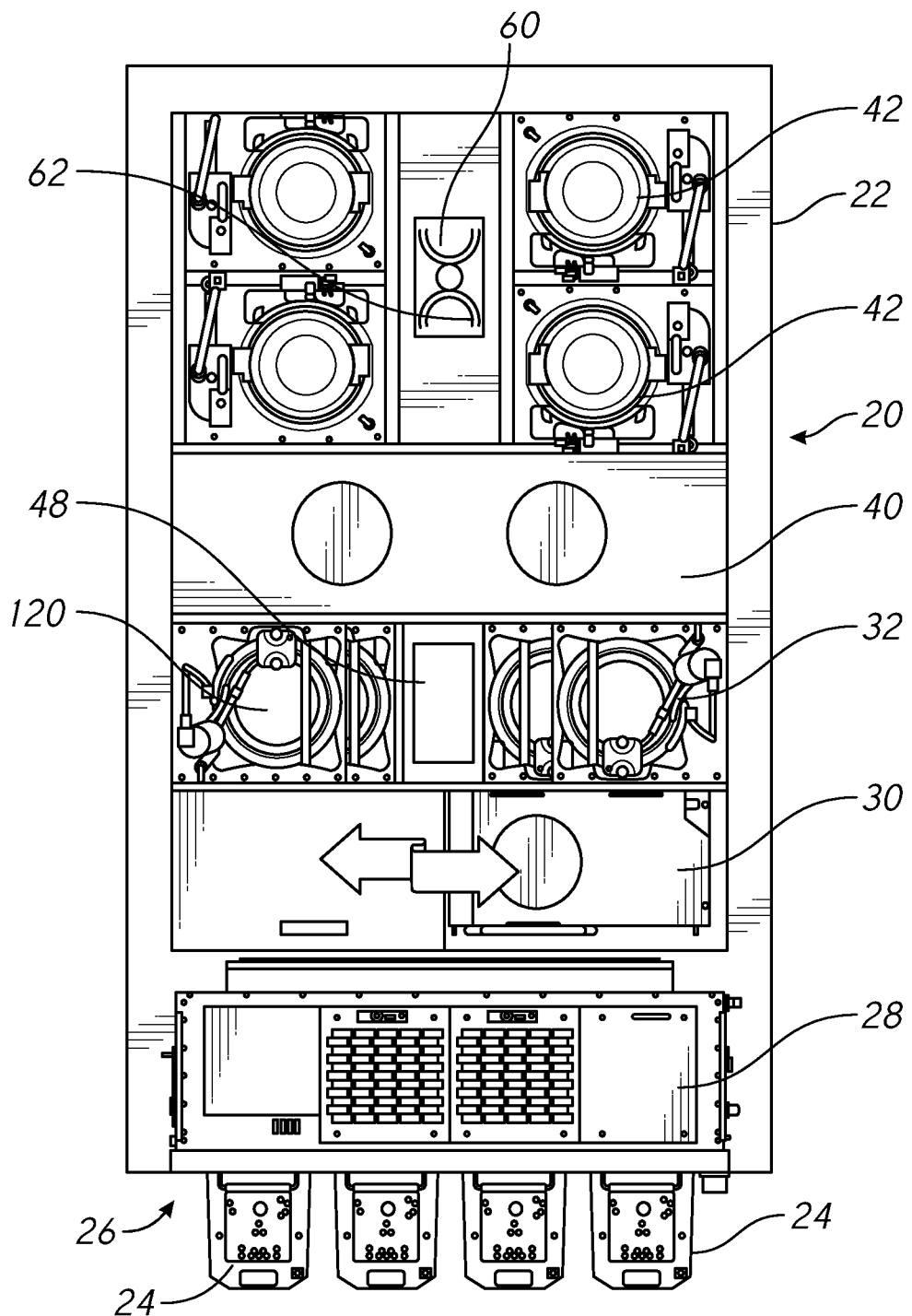
FIG. 1 is a plan view of a processing system.
Figure 2:
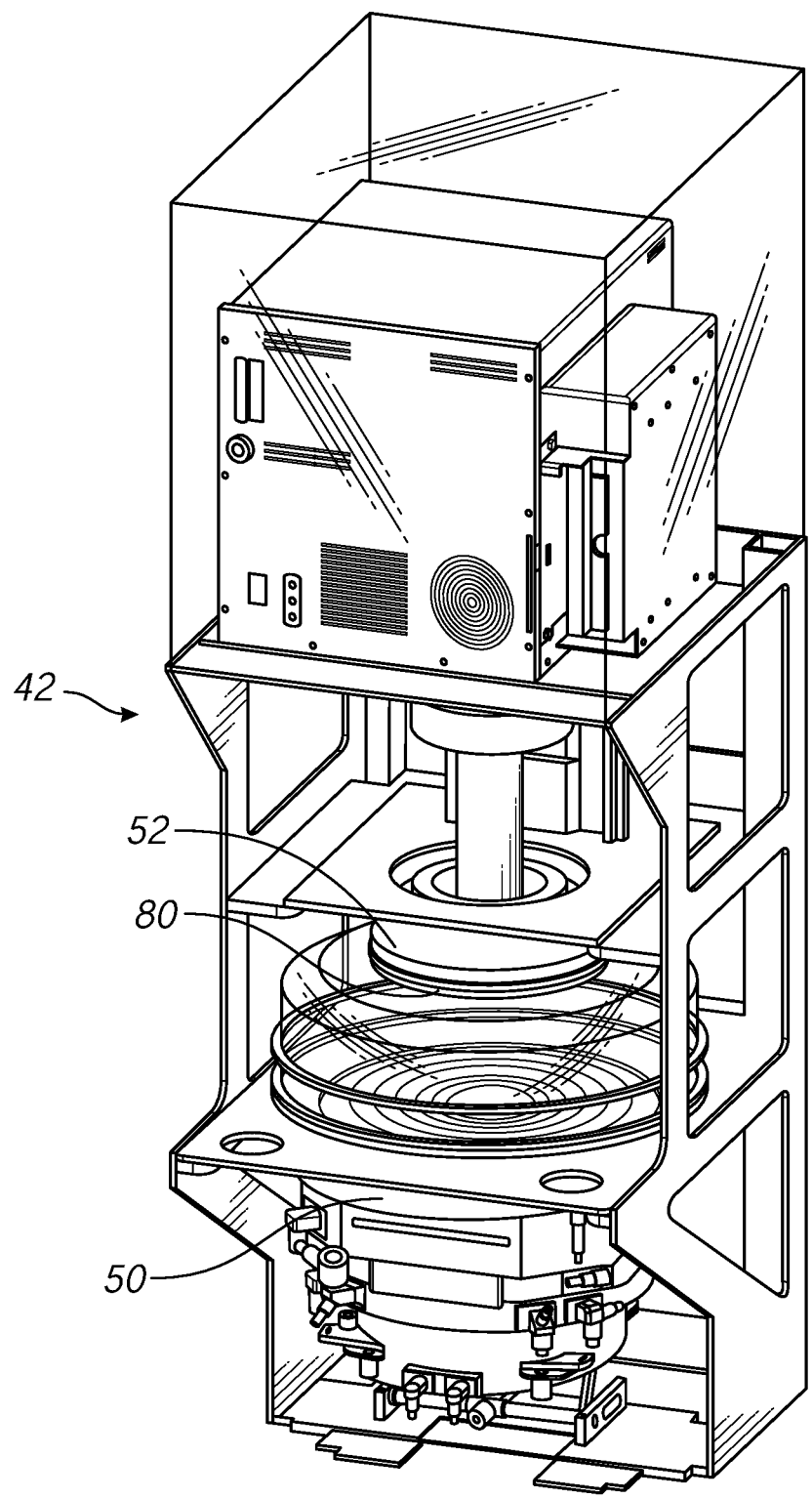
FIGS. 2-5 are perspective, side, front and plan views a processor as shown in FIG. 1.
Figure 3:
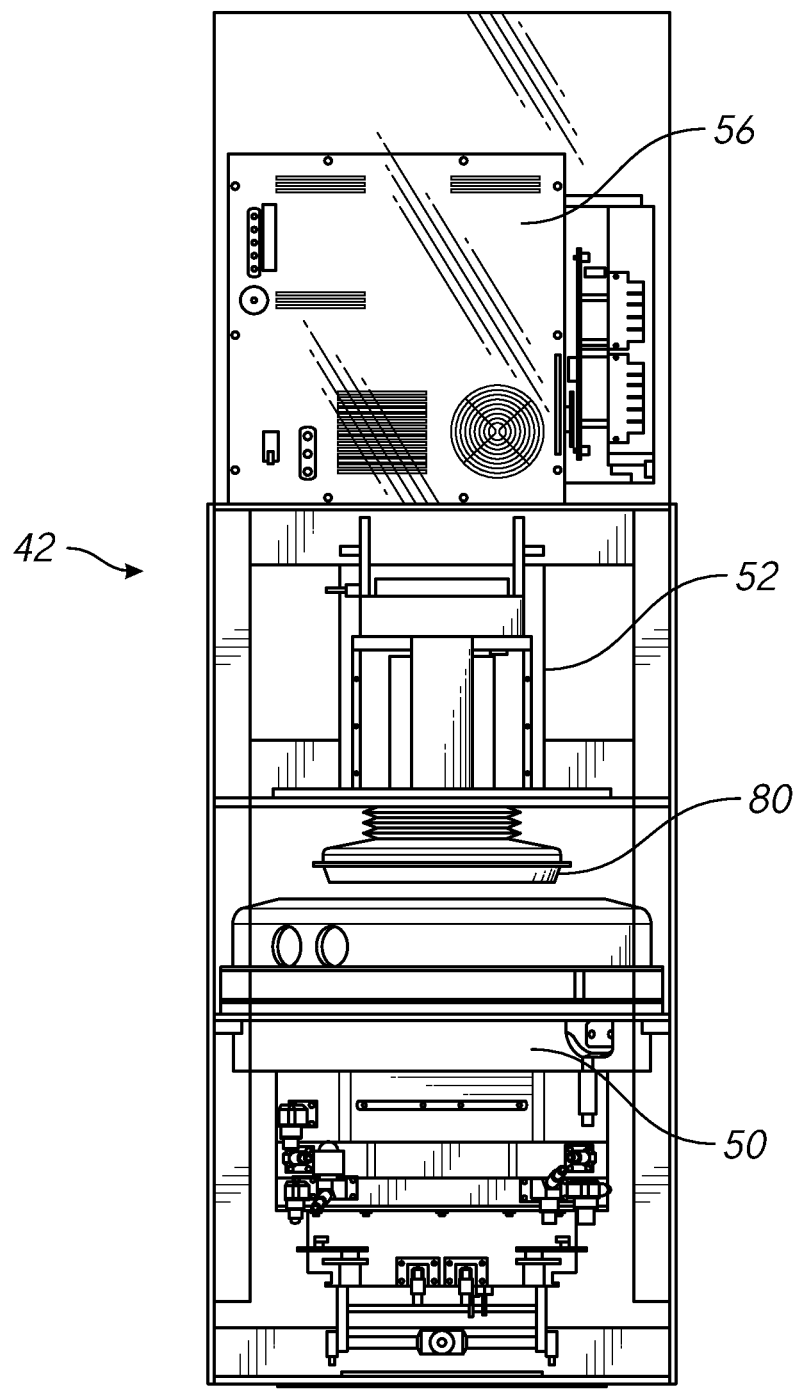
Figure 4:
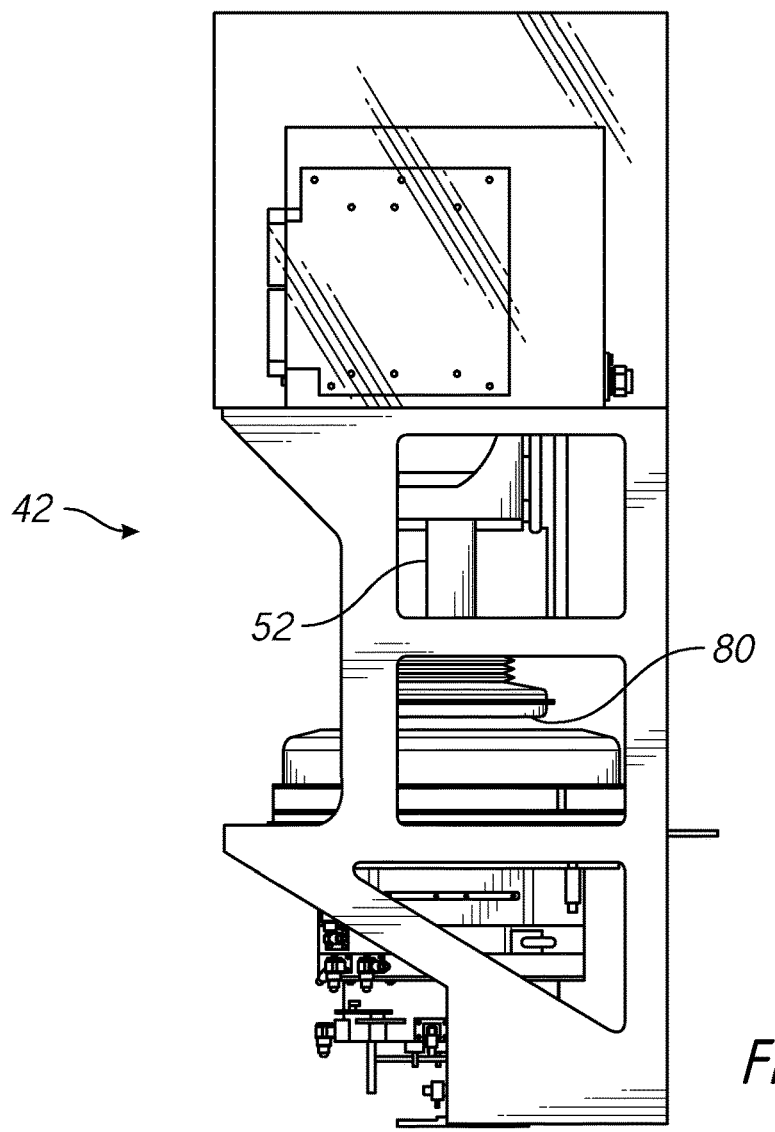
Figure 5:
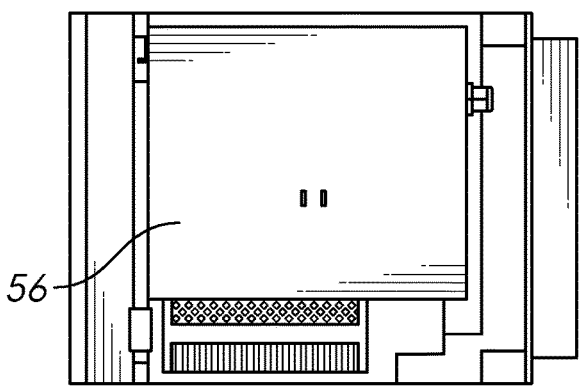

As shown in FIG. 1, a processing system 20 includes modules or subsystems within an enclosure 22. Wafer or substrate containers 24, such as FOUP (front opening unified pod) containers may be docked at a load/unload station 26 at the front of the enclosure 22. The subsystems used may vary with the specific manufacturing processes performed by the system 20. In the example shown, the system 20 includes a front interface 28, which may provide temporary storage for wafers to be moved into or out of the system 20, as well as optionally providing other functions. If provided, an anneal module 30, a rinse/dry module 32, a ring module 40 and electroplating chambers 42 may be sequentially arranged with the enclosure 22 behind the front interface 28. Robots move wafers between the subsystems. For example, a wafer robot 48 is positioned to move wafers between the anneal module 30 and the rinse/dry module 32. A chuck robot 60 is positioned to move chuck assemblies holding a wafer between the ring module 40 and the electroplating chambers 42. In a basic form the system 20 may include only one or more electroplating chambers and a ring module 40.

As shown in FIGS. 2-5 an electroplating chamber 42 may include a vessel or bowl 50 containing anodes, electrolyte and other components, for example as described in International Patent Publication WO2012/158966. The electroplating chamber or processor 42 also includes a head 52. The bowl 50 and the head 52 may be supported on a frame 54, with a power supply 56 or other auxiliary components also supported on the frame.

In a conventional electroplating processor, a contact ring is generally permanently attached to a rotor. As a result while the contact ring is being deplated, and/or the contact ring seal (if used) is being cleaned, the processor is idle in the sense that it is not processing a wafer. In the system 20 this drawback is overcome by making the contact ring removable from the rotor of the processor. This allows the contact ring to be quickly removed and replaced with a previously deplated contact ring. The processor idle time is greatly reduced.

Referring back to FIG. 1, wafers 120 are loaded into and out of the ring module 40 via the wafer robot 48. Within the ring module 40, contact rings are deplated. A wafer is clamped in place by a contact ring on a chuck. The assembly or unit of the wafer, the contact ring and the chuck is referred to here as a chuck assembly 76. The chuck assembly 76 is moved to a processor 42.

Figure 6:
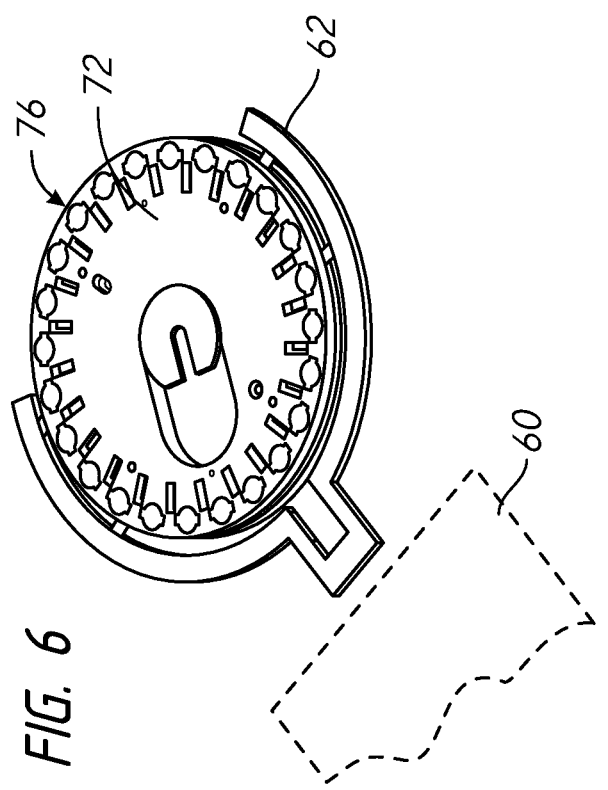
FIG. 6 is a perspective view of the robot arm in FIG. 1 holding a chuck assembly.
Figure 7:
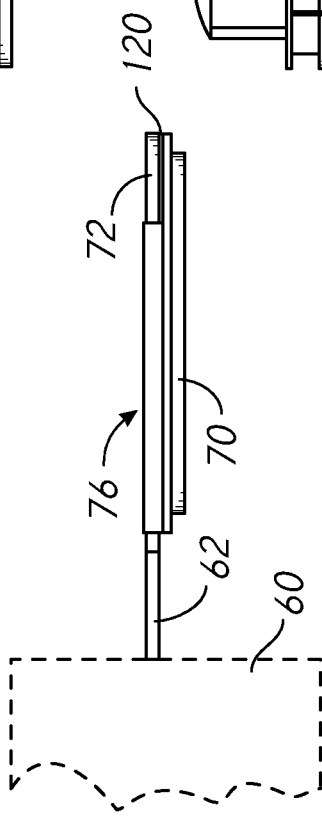
FIG. 7 is a side view of the robot moving a chuck assembly to a processor.
Figure 7:
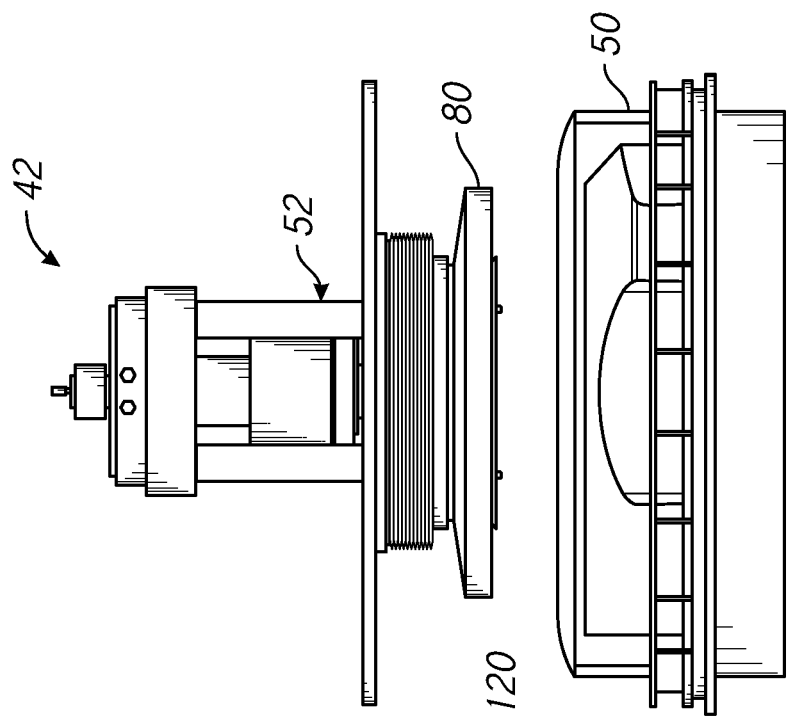
Figure 9:
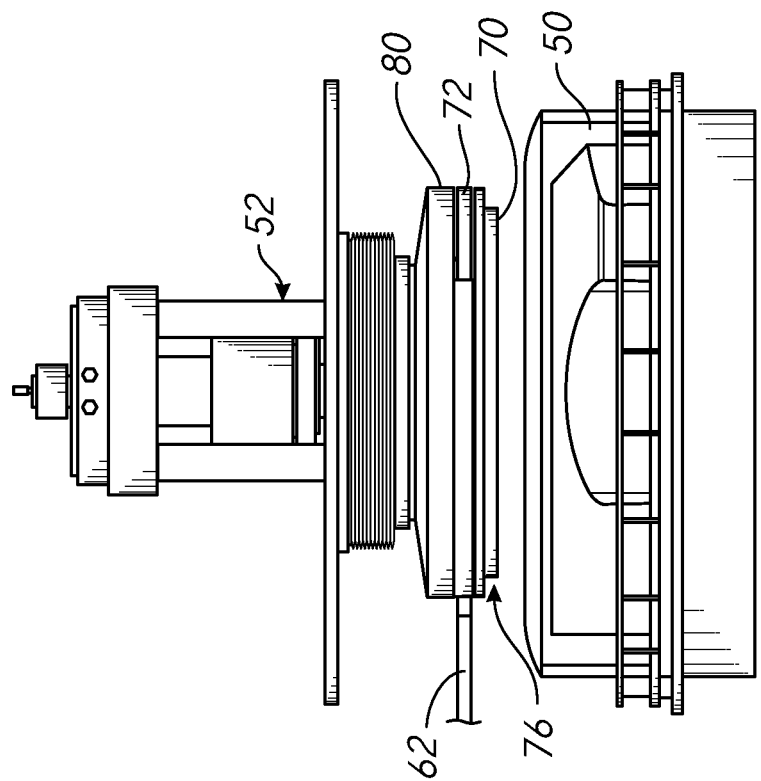
FIG. 9 is a side view showing the chuck assembly handed off and attached to the rotor.
Figure 8:
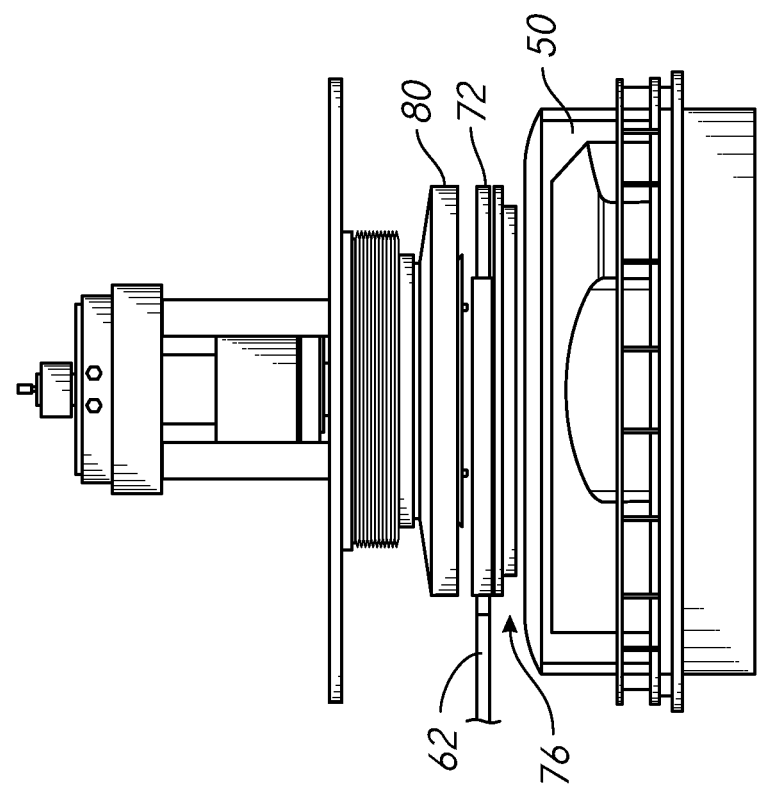
FIG. 8 is a side view showing the chuck assembly now aligned under the head of the processor.

FIGS. 6-9 show this movement of a chuck assembly 72 by the chuck robot 60. As described below, in the ring module 40, a contact ring 70 used in the processor 42 is attached to a chuck 72, with a wafer 120 clamped between them to form a chuck assembly 76. The chuck robot 60 then moves the chuck assembly 76 to a processor 42. As shown in FIG. 6, the chuck robot 60 may have a semi-circular end effector or arm 62 for engaging the chuck 72. The rotor 80 of the processor 42 is raised up away from the bowl 50. Referring to FIG. 8, the robot 60 advances the chuck assembly 76 into alignment with the rotor 80. As shown in FIG. 9, the chuck assembly 76 is then handed off to the rotor 80 with the chuck 72 securely attached to the rotor, and the robot 60 is withdrawn.

With the chuck assembly 76 in place on the rotor 80, the processor 42 is ready for processing a wafer. The head 52 moves the rotor 80 down from the load/unload position shown in FIG. 10A to the plating position shown in FIG. 10B, where the wafer 120 (clamped between the chuck and the contact ring) is in contact with the electrolyte in the bowl 50. Generally the rotor rotates the wafer during the plating process to provide a more uniform plated layer. FIG. 11 shows an enlarged view of the processor of FIG. 10B.

Figure 12:
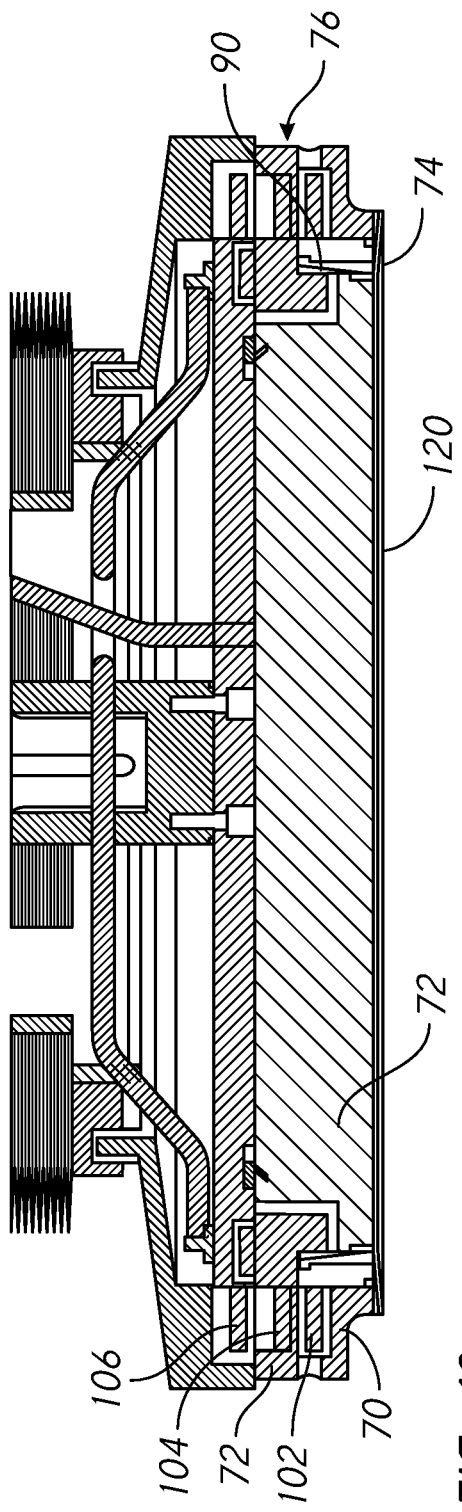
FIG. 12 is an enlarged section view of the chuck attached to the rotor.
Figure 13:
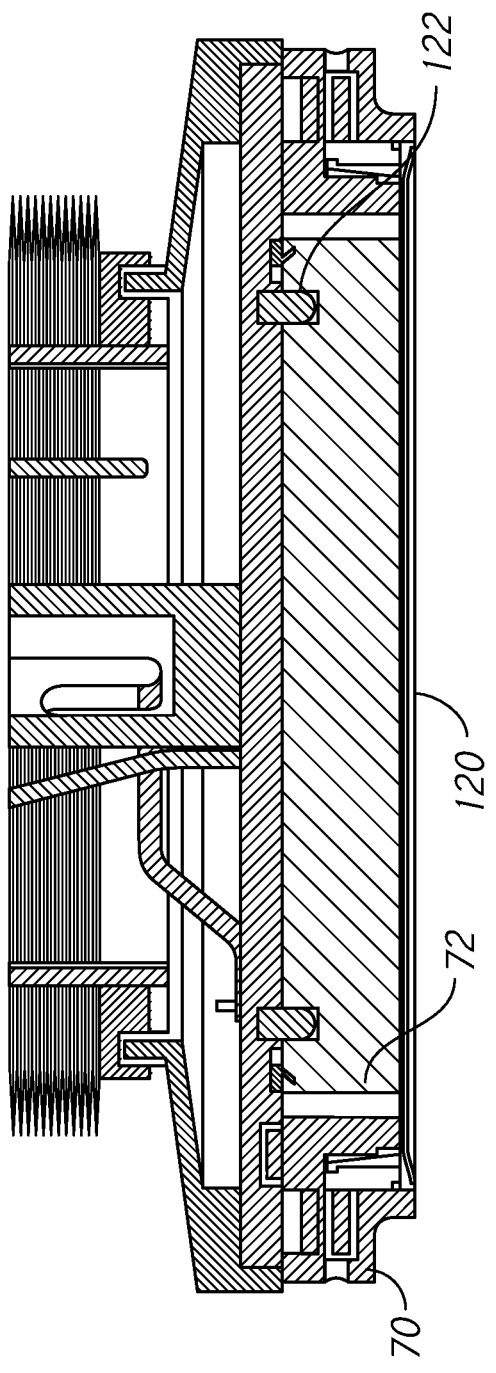
FIG. 13 is an enlarged alternative section view of the chuck assembly attached to the rotor.

Turning to FIG. 12, the contact ring 70 may be attached to the chuck 72 via contact ring magnets 102 exerting a magnetic attracting force on chuck magnets 104. The chuck 72 may similarly be attached to the rotor 80 during the hand off via the force of the chuck magnets 104 on rotor magnets 106 in the rotor 80. As shown in FIG. 13 alignment pins 122 projecting into openings in the top of the chuck may be used to align the chuck 72 with the rotor 80. The magnets may optionally be omitted with the contact ring and chuck attachments made using mechanical elements such as automatic fasteners or clamps.

Figure 14A:
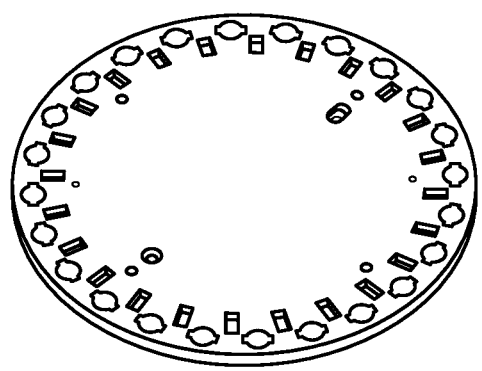
FIG. 14A is a perspective view of a contact ring.
Figure 14B:
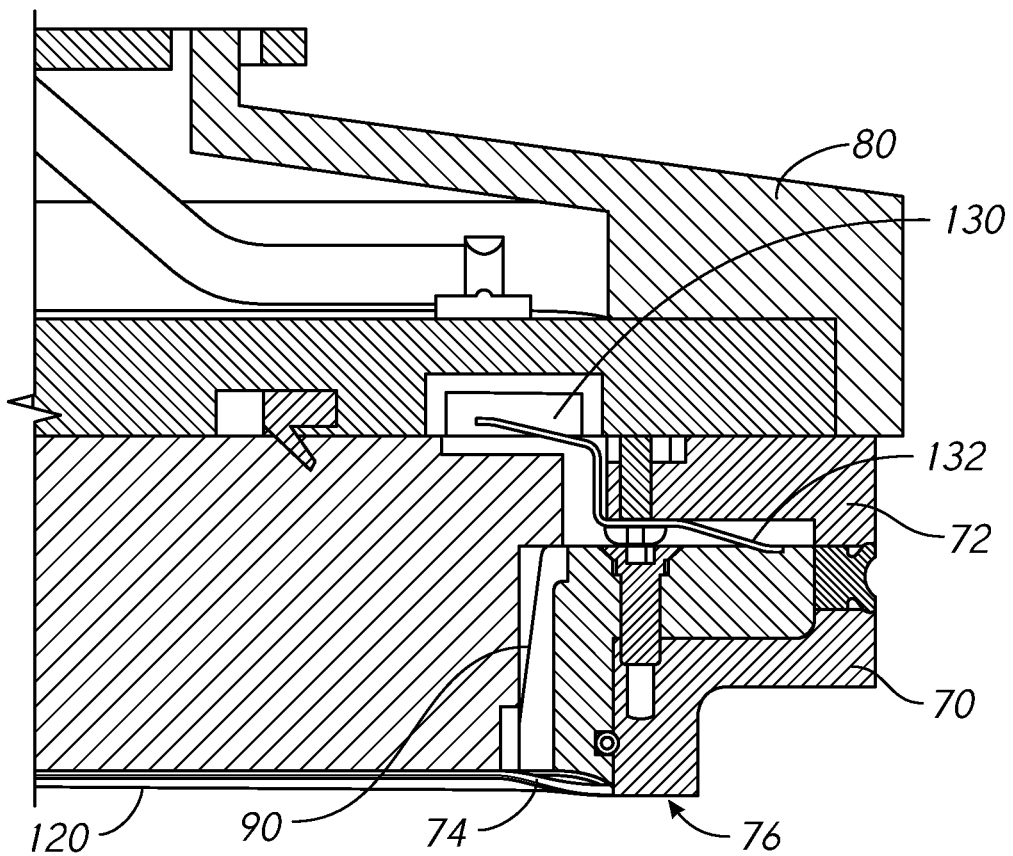
FIG. 14B is an enlarged detail section view of the electrical connection between the contact fingers on the ring contact to the chuck and the rotor.
Figure 14C:
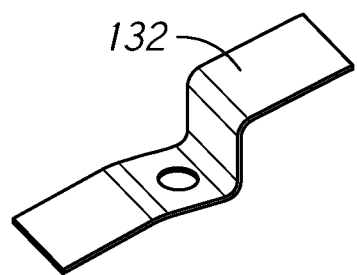
FIG. 14C is a perspective view of an electrical contact as shown in FIGS. 14A and 14B.

As shown in FIGS. 14A-14C, the contact ring 70 has a large number of individual contact fingers 74 that make actual physical and electrical contact with the wafer 120. Electrical current flows from the fingers 74 through ring conductors 90 to a plurality of radially spaced apart chuck contacts 132 on the chuck. The chuck contacts 132 touch a metal ring 130 in the rotor when the chuck is attached to the rotor. The metal ring 130 is connected to a current source, typically a cathode, via conductive elements in the head 52.

Figures 10A, 10B:
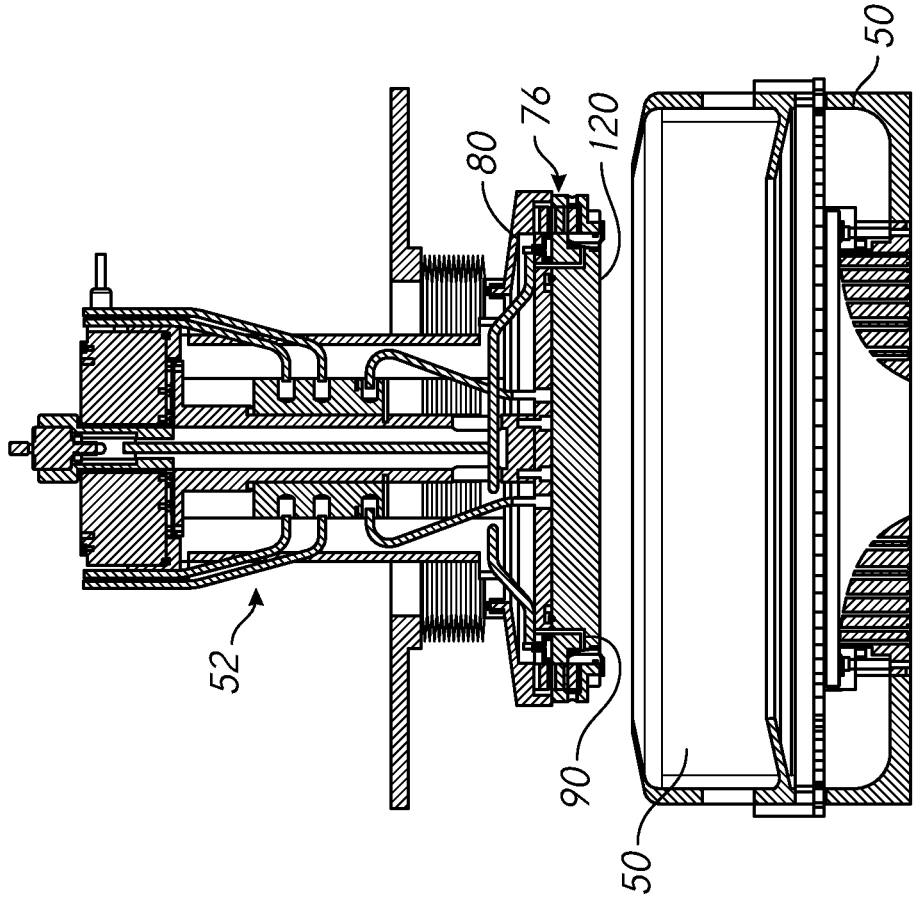
FIGS. 10A and 10B are side views showing the head with the chuck assembly attached to the rotor, with the head retracted in FIG. 10A and extended in FIG. 10B.
Figure 11:
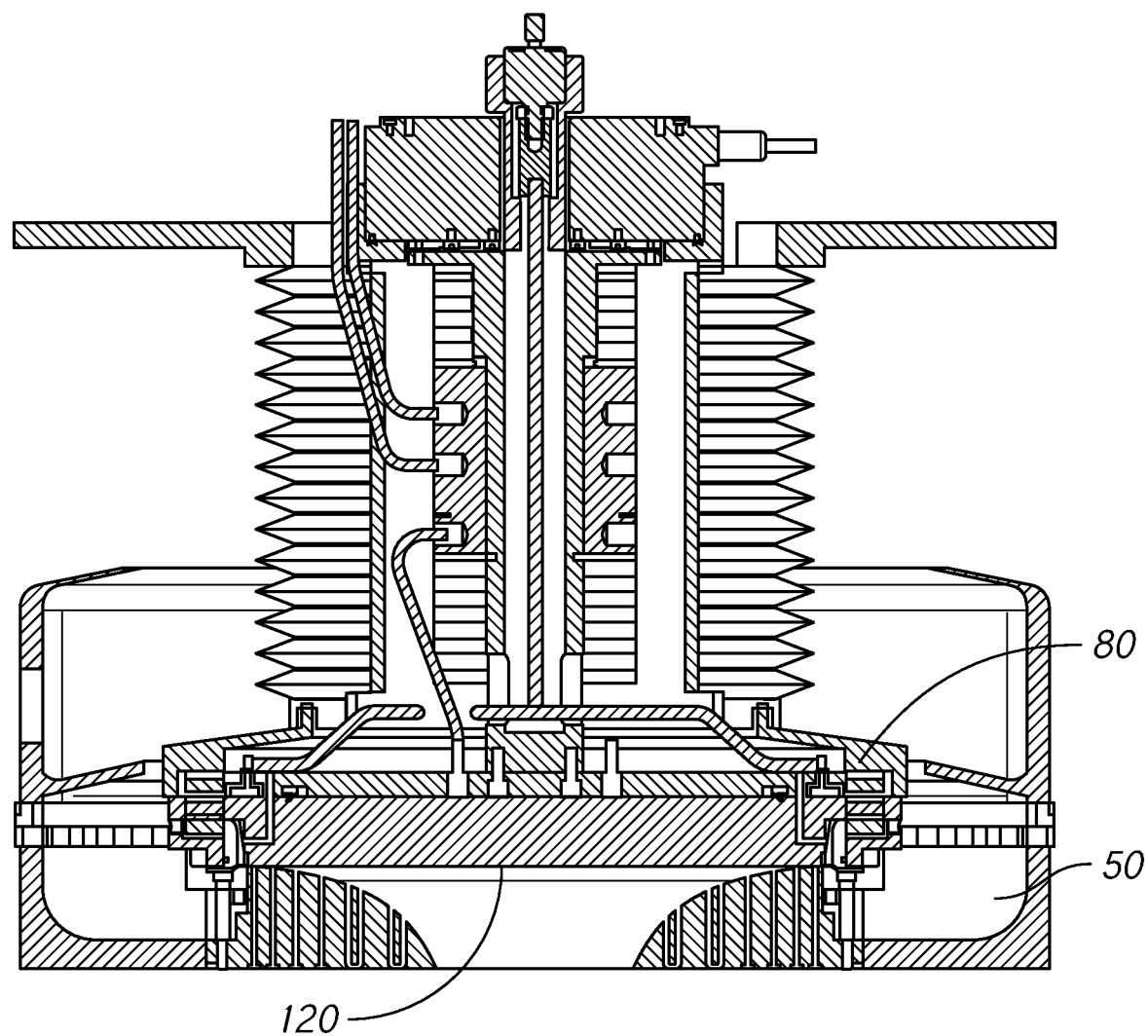
FIG. 11 is an enlarged view of the head.
Figure 15:
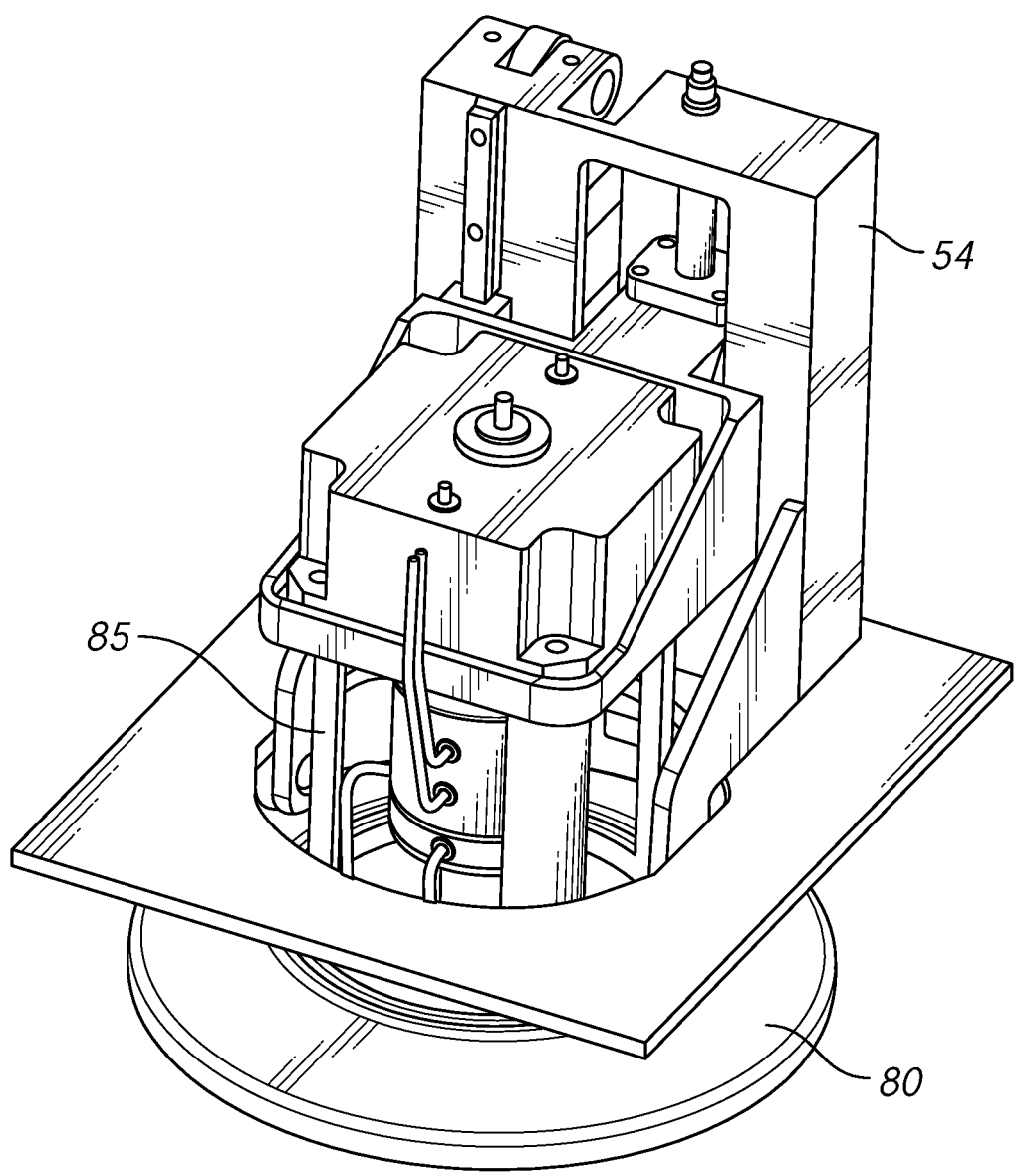
FIG. 15 is a front, top and left side perspective view of the head.
Figure 16:
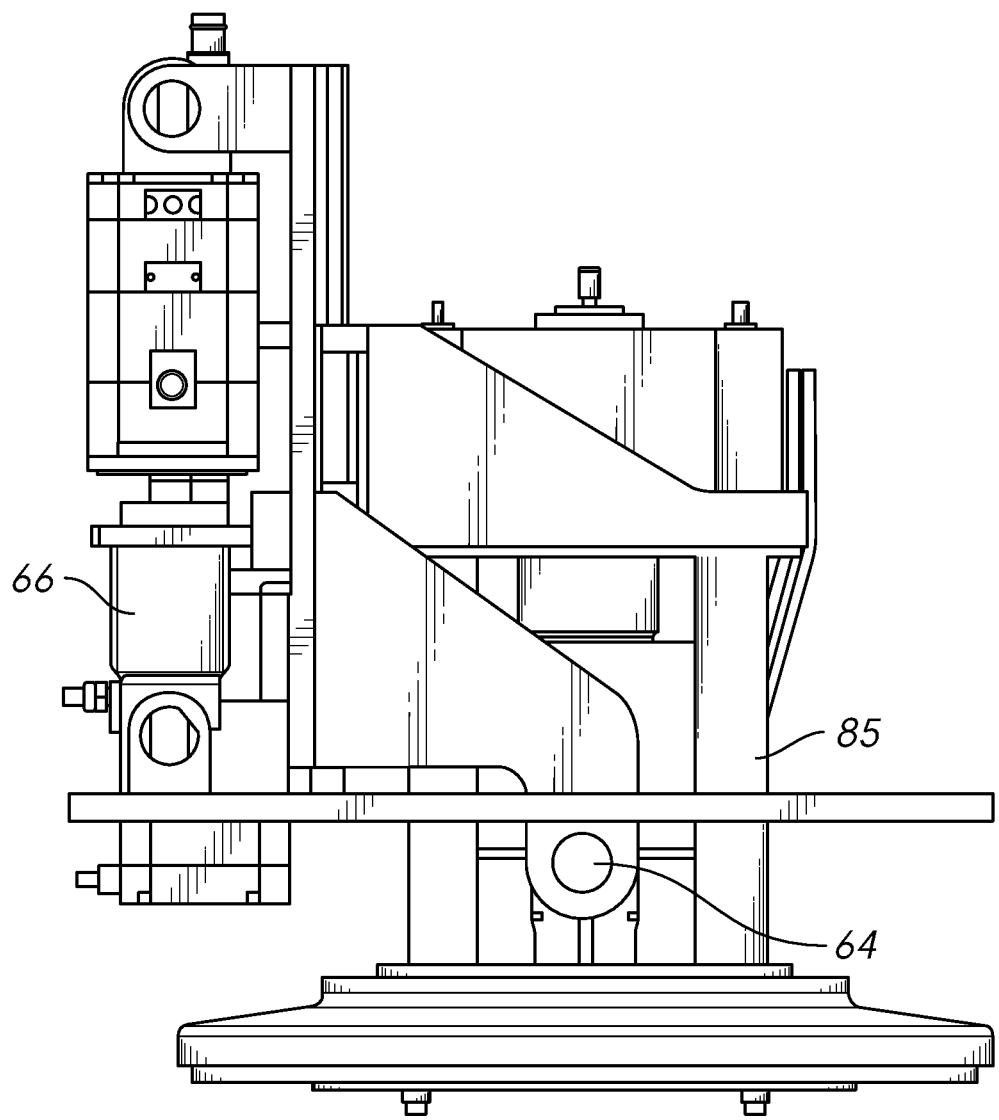
FIG. 16 is a side view of the head showing additional elements.
Figure 17:
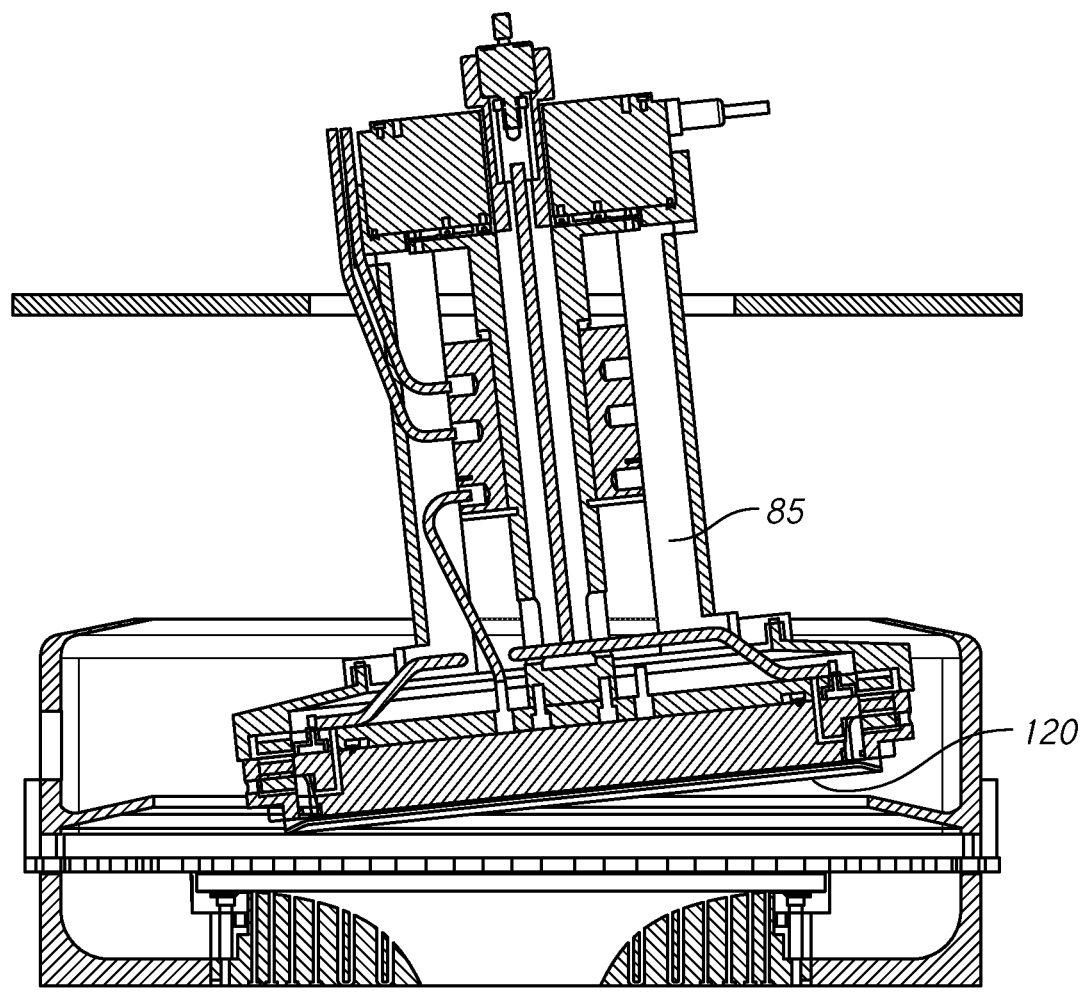
FIG. 17 is a side view of the head in a tilted orientation.
Figure 19:
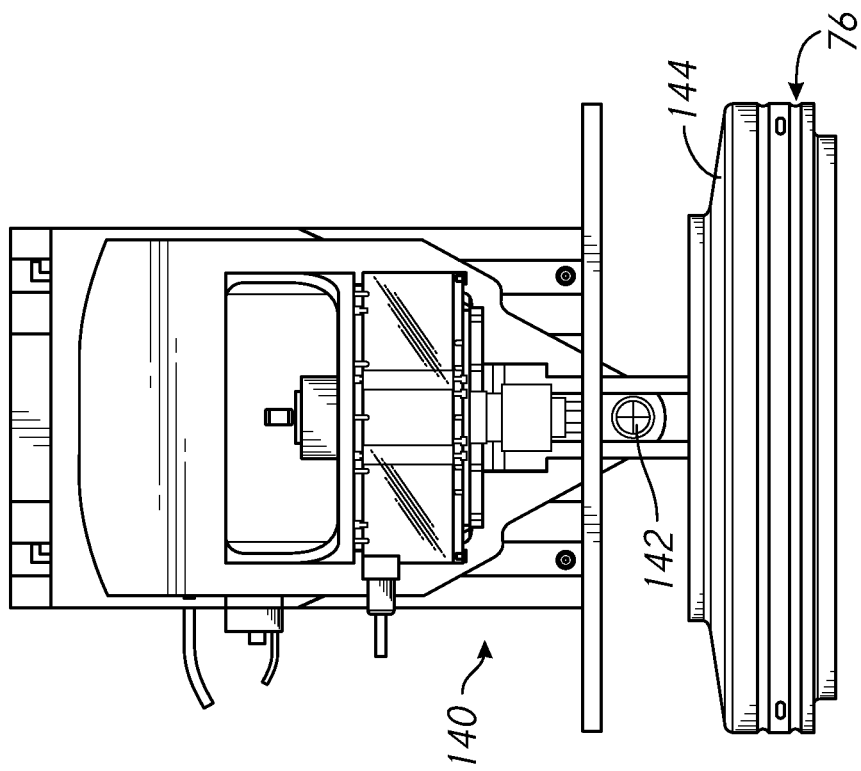
FIG. 19 is a side view of the head of FIG. 18.
Figure 18:
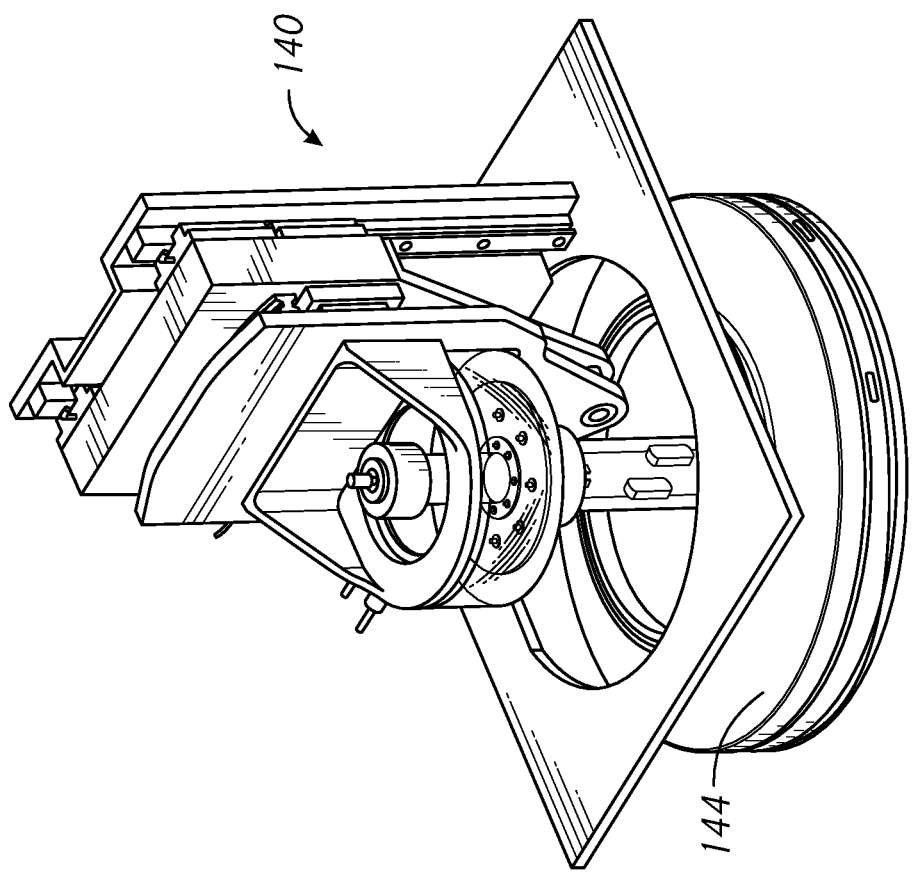
FIG. 18 is a front, top and left side perspective view of an alternative head.

FIGS. 15-17 show a head design which, in addition to lifting and lowering the rotor 80 as shown in FIGS. 10A-10B, can also tilt the rotor, to allow the wafer 120 to enter the electrolyte at an angle. In the design shown in FIGS. 15-17, the rotor frame 85 is pivoted about head pivot joints 64 by a pivot actuator 66. As shown in FIG. 17, tilting the rotor frame 85 correspondingly tilts the wafer 120. This allows the rotor 80 to move the wafer 120 into the electrolyte at an angle, to improve wetting characteristics and reduce bubble trapping. FIGS. 18-19 shown an alternative head 140 where the rotor frame is fixed (i.e., movable vertically only) and the rotor 144 is tilted about head pivot joints 142.

Figure 20:
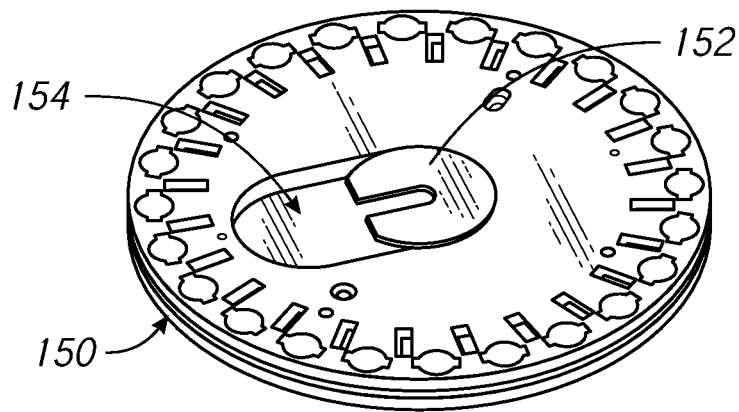
FIG. 20 is a perspective view of an alternative chuck.
Figure 21:
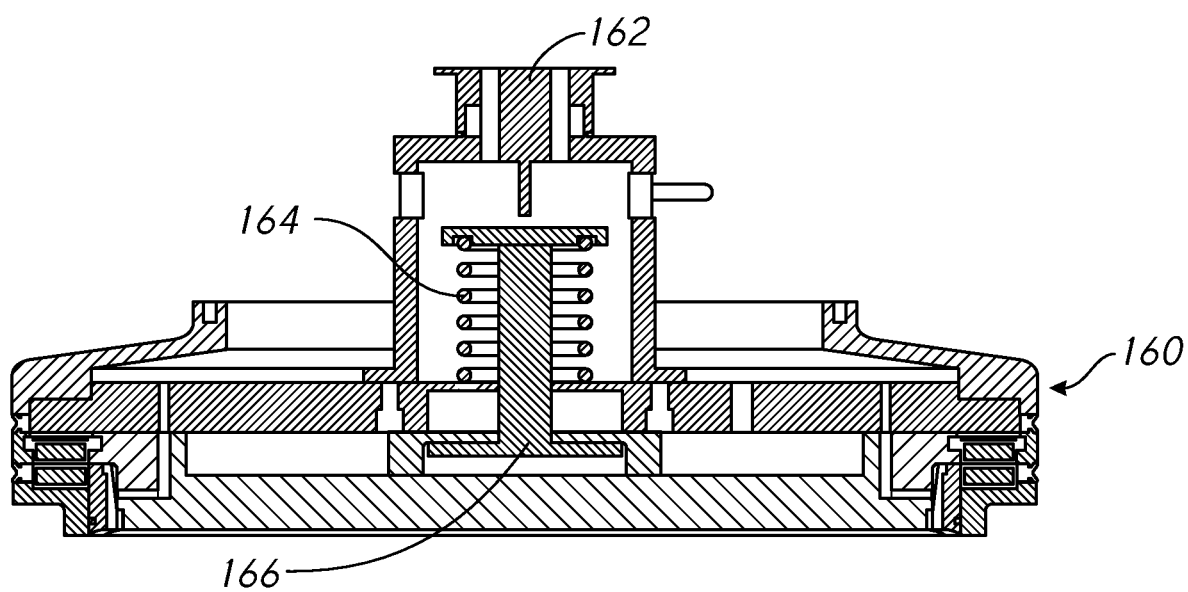
FIG. 21 is a section view of an alternative rotor adapted for use with the chuck shown in FIG. 20.

FIG. 20 shows an alternative chuck 150 for use with an alternative rotor 160 shown in FIG. 21. The chuck 150 has a slot plate 152 and a lead-in recess 154. The rotor 160 has a clamp rod 166 urged up by a spring 164. An actuator 162 in the head is positioned to move the clamp rod 166 down against the force of the spring.

Figure 22A:
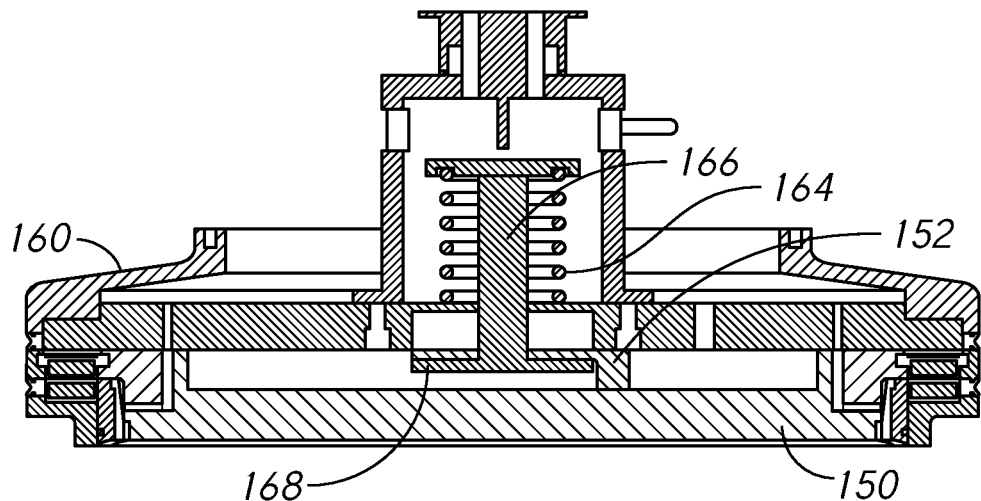
FIGS. 22A-22D are section views showing a sequence of steps for unclamping the chuck assembly of FIG. 20 from the rotor of FIG. 21.
Figure 22B:
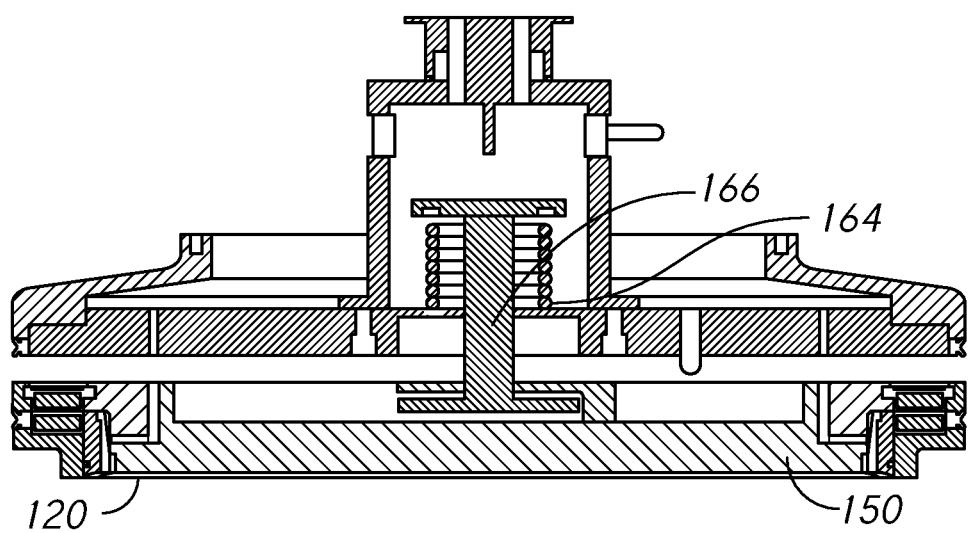
Figure 22C:
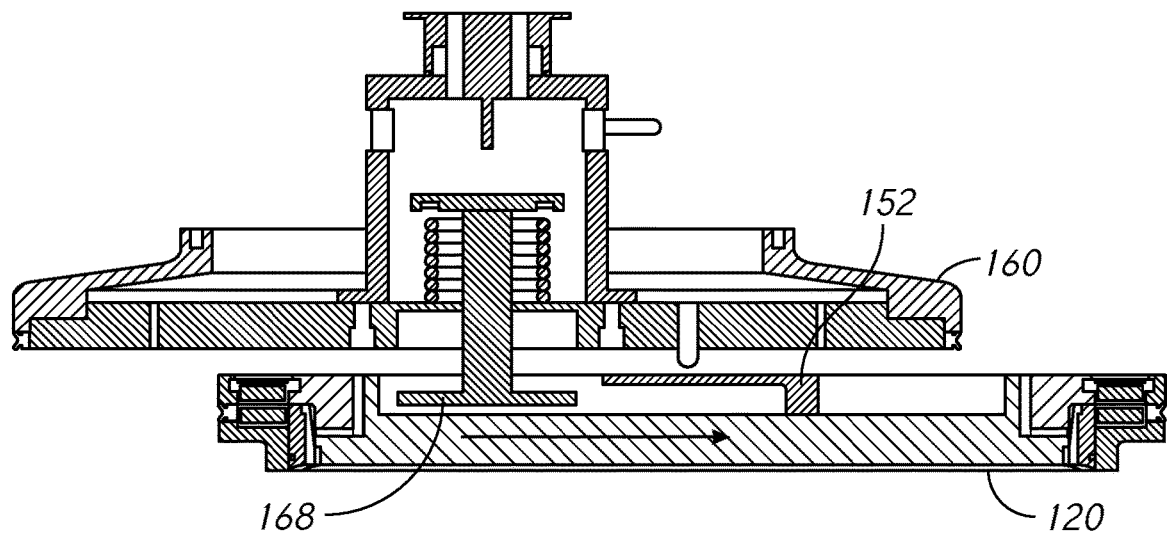
Figure 22D:
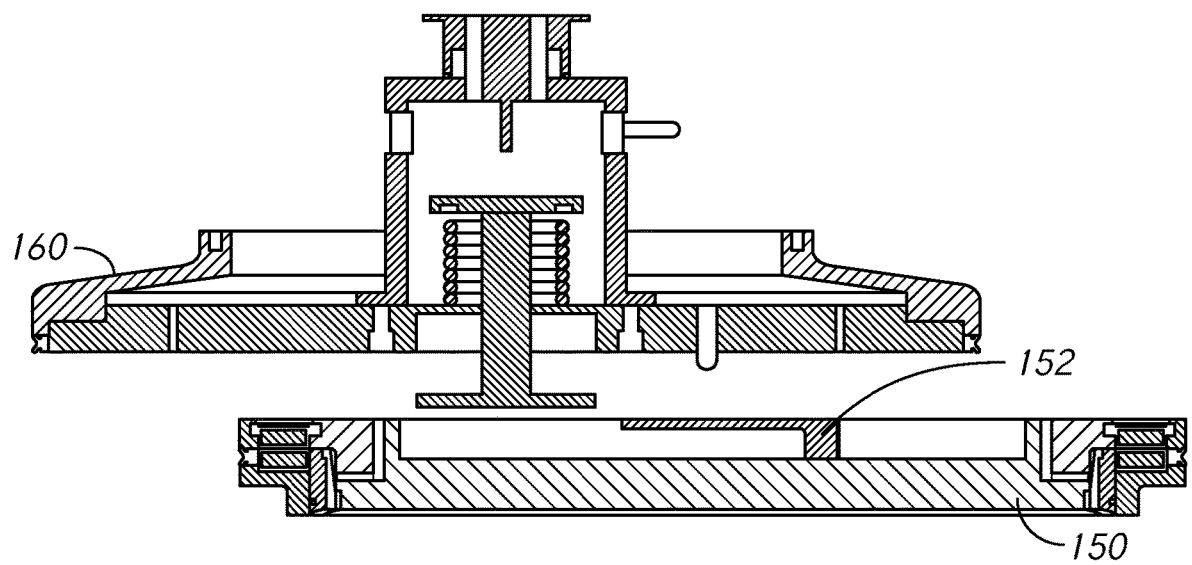

FIGS. 22A-22D shown the chuck unclamping sequence. In FIG. 22A, with the actuator off, the spring holds the clamp rod up. The head 168 of the clamp rod 166 is secured under the slot plate 152, so that the chuck is securely clamped onto the rotor via the force of the spring. In FIG. 22B the actuator is energized pushing the clamp rod down and separating the chuck from the rotor. In FIG. 22C the chuck robot 60 moves the chuck laterally causing the head of the clamp rod to move out from under the slot plate and into the recess 154. In FIG. 22D, the robot 60 then lowers and removes the chuck assembly 76 from the rotor and delivers it to the ring module 40. At the ring module 40 the robot 60 drops off the chuck assembly 76 and picks up a new chuck assembly 76 having an unprocessed wafer. The robot 60 then moves the new chuck assembly 76 to a processor where it is loaded using the reverse sequence of steps shown in FIGS. 22A-22D. The rotors, chucks and contact rings may be uniform (having the same size and shape) so that the chuck assemblies may be used interchangeably.

Within the ring module, contact rings are deplated and contact seals, if present, may be cleaned. The deplating and/or seal cleaning may be performed with the contact ring attached to the chuck. In this type of system, the chuck and the contact ring may be substantially permanently attached to each other. Alternatively a modified contact ring suitable for handling and attachment to the head, in the same way as the chuck is, may be used, essentially as a combination contact ring/chuck. In this design the functional elements of the chuck are included in the contact ring, with no separate chuck provided. For example, the contact ring may be provided with an integrated backing plate, with contact fingers of the contact ring movable towards and away from the backing plate, to load and unload a wafer.

The contact ring may also be detached and separated from the chuck during deplating and/or cleaning. In this type of system, each deplated contact ring is attached to a chuck with an unprocessed wafer clamped between them, with the resulting chuck assembly 76 then positioned for pick up by the robot 60. Also within the ring module 40, chuck assemblies 76 returning from a processor 42 are opened, i.e., the processed wafer is unclamped and removed, for pick up by the wafer robot 48.

Figure 23:
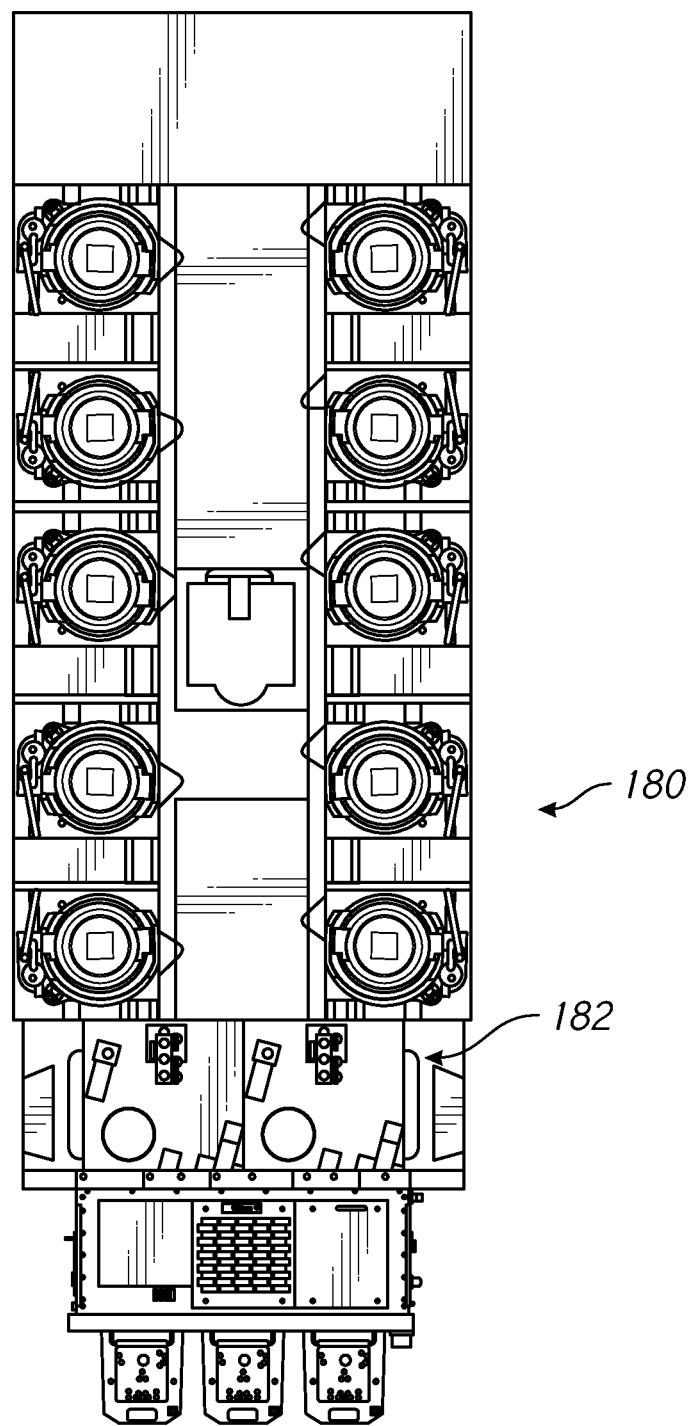
FIG. 23 is a plan view of an alternative processing system.

The system 20 shown in FIG. 1 may be used for copper Damascene plating. FIG. 23 is a top view of another system 180 which may be used for wafer level packaging (WLP). The system 180 may omit the anneal chamber 30. The spin rinser dryer chambers 32 may be combined with the contact ring station 40 into a support module 182. The support module 182 may also include one or more vacuum prewet chambers. In comparison to the system 20 shown in FIG. 1, in the system 180 shown in FIG. 23, the wafer chucking/dechucking steps are performed in the support module 182, towards the front end of the system, rather than at a more central position as in FIG. 1. The support module may be provided with three spin rinser dryer chambers, two vacuum pre wet chambers and two contact ring stations.

Referring still to FIG. 23, the system 182 may have up to 20 metal plating chambers 42 set up in groups for plating three different metals, such as copper, nickel and tin-silver. These metal plating chambers may be on two levels in a stack configuration. The robots and chuck operations described above for use in the system 20 may also be used in the system 180.

Thus, novel systems and methods have been shown and described. Various changes and substitutions may of course be made without departing from the spirit and scope of the invention. The invention, therefore, should not be limited except by the following claims and their equivalents. Wafer means a silicon or other semiconductor material wafer, or other type substrate or workpiece used to make microelectronic, micro-electro-mechanical, or micro-optical devices. The systems described may be suitable for use with 150, 200, 300 or 450 mm diameter wafers.

The invention claimed is:

1. A chuck assembly comprising:
a chuck plate having an up-facing surface and a bottom surface;
a slot plate having a vertical section attached to the up-facing surface of the chuck plate, and the slot plate having a horizontal section parallel to the up-facing surface, the slot plate having an L-shaped cross section, the slot plate forming a slot between the up-facing surface and the horizontal section of the slot plate, the slot facing a lead-in recess in the chuck plate;
a contact ring on the bottom surface of the chuck plate, with the contact ring having a plurality of contact fingers adapted to contact a workpiece between the contact ring and the chuck plate; and
at least one chuck contact on the chuck plate making electrical contact with the plurality of contact fingers of the contact ring.

2. The chuck assembly of claim 1 further including an annular seal on the contact ring.

3. The chuck assembly of claim 1 further including one or more chuck magnets on or in the chuck plate, and one or more contact ring magnets on or in the contact ring.

4. The chuck assembly of claim 1 further including one or more alignment pins extending up from the up-facing surface of the chuck plate, for aligning the chuck plate with a rotor of an electroplating system.

5. The chuck assembly of claim 1 further including a plurality of electrical chuck contacts extending from the up-facing surface of the chuck plate to the contact ring.

6. The chuck assembly of claim 1 further including one or more ring conductors electrically connecting the at least one chuck contact to the contact ring.

7. A chuck assembly for use in an electroplating system having a rotor, comprising:
a chuck plate having an up-facing surface and a bottom surface;
a contact ring on the bottom surface of the chuck plate, with the contact ring having a plurality of contact fingers adapted to contact a workpiece between the contact ring and the chuck plate;
a slot plate having a vertical section on the up-facing surface of the chuck plate, and the slot plate having a horizontal section parallel to the up-facing surface, the slot plate forming a slot between the up-facing surface and the horizontal section of the slow plate, the slot facing a lead-in recess in the chuck plate, the slot configured to receive a component of the rotor of the electroplating system;
the horizontal section of the slot plate extending across a center of the chuck plate; and
at least one chuck contact on the chuck plate making electrical contact with the plurality of contact fingers of the contact ring.

8. The chuck assembly of claim 7 further including an annular seal on the contact ring.

9. The chuck assembly of claim 8 further including one or more chuck magnets on or in the chuck plate, and one or more contact ring magnets on or in the contact ring.

10. The chuck assembly of claim 8 further including one or more alignment pins extending up from the up-facing surface of the chuck plate, for aligning the chuck plate with the rotor of the electroplating system.

11. The chuck assembly of claim 7 further including a plurality of electrical chuck contacts extending from the up-facing surface of the chuck plate to the contact ring.

12. The chuck assembly of claim 7 further including one or more ring conductors electrically connecting the at least one chuck contact to the contact ring.

13. A chuck assembly comprising:
a chuck plate having an up-facing surface and a bottom surface;
a slot plate having a vertical section attached to the up-facing surface of the chuck plate, and the slot plate having a horizontal section parallel to the up-facing surface, the slot plate forming a slot between the up-facing surface and the horizontal section of the slot plate, the slot facing a lead-in recess in the chuck plate, the slot configured to receive a component of a rotor of a substrate electro-processing system;
a contact ring on the bottom surface of the chuck plate, with the contact ring having a plurality of contact fingers adapted to contact a workpiece between the contact ring and the chuck plate; and
at least one chuck contact on the chuck plate making electrical contact with the plurality of contact fingers of the contact ring.

* * * * *